United States Patent
Drewes

(10) Patent No.: US 6,870,714 B2
(45) Date of Patent: Mar. 22, 2005

(54) OXIDE BUFFER LAYER FOR IMPROVED MAGNETIC TUNNEL JUNCTIONS

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/385,858

(22) Filed: Mar. 12, 2003

(65) Prior Publication Data

US 2004/0180237 A1 Sep. 16, 2004

(51) Int. Cl.$^7$ .............................................. G11B 5/127
(52) U.S. Cl. .............................. 360/324.1; 360/324.2; 428/611; 428/632; 428/678; 428/336; 428/692; 428/702
(58) Field of Search ................................. 428/611, 632, 428/678, 336, 692, 702; 360/324.1, 324.2

(56) References Cited

U.S. PATENT DOCUMENTS

| | | | |
|---|---|---|---|
| 6,638,774 B2 * | 10/2003 | Raberg | 438/3 |
| 2002/0054461 A1 * | 5/2002 | Fujiwara et al. | 360/324.1 |
| 2004/0042246 A1 * | 3/2004 | Drewes et al. | 365/145 |

* cited by examiner

*Primary Examiner*—Kevin M. Bernatz
(74) *Attorney, Agent, or Firm*—Dickstein Shapiro Morin & Oshinsky LLP

(57) ABSTRACT

A metal manganese oxide buffer layer is used to seed a barrier layer in a magnetic tunnel junction memory element having pinned and free magnetic layers. An alumina tunnel barrier layer is formed on the oxidized metal manganese layer with the barrier layer and oxidized metal manganese layer being between the pinned or free ferromagnetic layers.

64 Claims, 4 Drawing Sheets

OXIDE BUFFER LAYER FOR IMPROVED MAGNETIC TUNNEL JUNCTIONS

BACKGROUND OF THE INVENTION

1. Field of the Invention

The invention relates to magnetic film layers, and more specifically to providing smooth barrier layers in magnetoresistive devices.

2. Brief Description of the Related Art

Magnetoresistive devices are known which take advantage of a magnetoresistive effect in electrically-conductive, multilayer structures containing ferromagnetic regions. The magnetoresistive effect is characterized by changes in electrical conductivity within the device due to the relative orientation of magnetic moments in the ferromagnetic regions. The magnetic orientation can be controlled by external fields, for example. Typically, the relative alignment of magnetic moments in the ferromagnetic regions can be parallel or antiparallel. Parallel alignment gives rise to one resistance in the device, whereas antiparallel alignment produces a different resistance. The different resistance values of the device can be translated into different logic signals.

Examples of magnetoresistive devices include magnetic memory cells, which typically are used in magnetic random access memory systems, and magnetic sensors, examples of which include disk drive read sensors in magnetic disk storage systems.

The typical structure used in magnetoresistive devices is a sandwich of two ferromagnetic layers separated by a non-magnetic layer. The magnetic orientation of one ferromagnetic layer is fixed to provide a reference, while the magnetic orientation of the other ferromagnetic layer remains free to be reoriented under the influence of external forces, such as magnetic bits on a storage disk, or an induced magnetic field controlled by a computer memory system. As an example of a memory system, magnetic memory cells are employed in magnetic random access memory (MRAM) devices to store information as the orientation of magnetic moments in a ferromagnetic region. Magnetic memory cells typically include a non-magnetic tunnel junction layer formed between two ferromagnetic layers. The two ferromagnetic layers include a pinned (fixed) ferromagnetic layer and a free ferromagnetic layer.

An example of such a memory cell 2 is illustrated by the magnetic tunnel junction (MTJ) memory cell of FIG. 1, in which two ferromagnetic layers, 4 and 6, are separated by a thin non-magnetic tunnel barrier layer 8. Memory cell 2 generally is formed over a substrate 10, such as a silicon substrate, for example. The memory cell may be separated from the substrate containing active devices by one or more insulating layers, such as tetra-ethyl-ortho-silicate (TEOS) layer 12. A protective cap layer 14 is provided on top of the memory cell. The pinned and free ferromagnetic layers typically are formed of one or more layers of NiFe or CoFe and the non-magnetic barrier layer 8 typically is formed of aluminum oxide ($Al_2O_3$) or Cu. Magnetic memory cells can hold stored information for a long time, without the need for a current supply or data refresh, and thus are non-volatile. MTJ cells can be used in non-volatile magnetic memory storage cells, which can replace conventional capacitive storage cells in DRAM memory devices, for example.

An amount of current allowed to tunnel across barrier 8 in MTJ cell 2 depends on the orientation of the magnetic moments of ferromagnetic layers 4 and 6. The tunneling current is higher when the magnetic moments are aligned parallel to one another, giving rise to a magnetic-tunneling effect. Configured for use as a memory storage cell, the MTJ is arranged so that the magnetic moment of pinned ferromagnetic layer 4 is fixed, hence "pinned," while the magnetic orientation of free ferromagnetic layer 8 is established by an external field, thereby controlling the magnetoresistive state of the MTJ memory cell.

Magnetic sensors, known also as spin valves, based on a giant magnetoresistance (GMR) effect, have a structure similar to that of magnetic tunnel junction devices. Used as disk drive read heads, for example, the sensor structure 20 essentially includes four thin layers of material, as shown in FIG. 2. A free layer 22 is the sensing layer, commonly made of nickel, iron, or cobalt alloys. An orientation of magnetic moments rotates in free layer 22 in response to the magnetic patterns on a disk, for example, as the read head passes over the surface of the data bits to be read. Pinned layer 24, generally formed of a cobalt material, is held in a fixed magnetic orientation by an adjacent exchange layer 26. Spacer layer 28 is nonmagnetic, typically made from copper, and is disposed between the free and pinned layers. Exchange layer 26 is made of an "antiferromagnetic" material, typically constructed from iron and manganese, and fixes the pinned layer's magnetic orientation.

During read head operation, when electrons in the free layer become aligned with those of the pinned layer, a lower resistance is created in the entire head structure. When the head passes over a magnetic field of the opposite polarity ("1"), electrons in free layer 22 rotate so that they are not aligned with those of the pinned layer, causing an increase in the resistance of the overall sensor structure 20. The resistance changes are caused by changes to the spin characteristics of electrons in the free layer.

The manner of fabricating MTJ and GMR devices impacts their magnetic and magnetoresisitive properties. Surface and interface effects which may affect properties of the fabricated devices include interlayer coupling, Néel coupling, surface diffusion, interdiffusion at interfaces, and specular electron scattering at surfaces. In some GMR devices, it is possible to control these factors or to use them to manipulate the growth or improve post-growth processing of spin valves to improve their magnetic and magnetoresistive properties. Specular scattering is particularly important for achieving the largest possible GMR values. In MTJs, coupling between layers introduces an unwanted magnetic field bias threshold that must be overcome to switch magnetic moments from one orientation to another.

Magnetoresistive devices, based on MTJ and GMR structures, are being produced on a smaller and smaller physical scale, with nanoscale structures becoming feasible. At these smaller dimensions, effects of aberrant surface morphology become increasingly more significant. During typical magnetic element fabrication, such as MRAM element fabrication, which includes metal films grown by sputter deposition, evaporation, or epitaxy techniques, the film surfaces are not absolutely flat but instead exhibit surface or interface waviness. This waviness of the surfaces and/or interfaces of the ferromagnetic layers is the cause of magnetic coupling between the free ferromagnetic layer and the other ferromagnetic layers, such as the fixed layer. This is known as topological coupling or Néel coupling. Such coupling typically is undesirable in magnetic elements because it creates the magnetic field bias offset in the response of the free layer to an external magnetic field.

Since microscopic discrepancies in surface smoothness influence the magnetic behavior of the layers, improved manufacturing processes are required to produce film layers having small grain size and smooth, consistent surfaces, to minimize the extraneous dipoles that influence Néel coupling, and increase specular scattering.

BRIEF SUMMARY OF THE INVENTION

The present invention seeks to mitigate problems caused by surface roughness in magnetoresistive device structures. A buffer layer is deposited and a non-magnetic barrier or spacer layer is grown on the buffer layer. Growing the non-magnetic layer on the buffer layer leads to decreased grain size of the non-magnetic layer. The decreased grain size provides a smoother surface. As a result, the surface will exhibit fewer extraneous magnetic dipoles and reduced inter-plane coupling. In general, the smoother surfaces will reduce topological magnetostatic interlayer coupling effects, such as Néel coupling.

The decreased grain size of the deposited layer also will increase the oxidation probability which facilitates the use of natural oxidation or thermal and/or UV assisted oxidation. Also, the smoother barrier layers have fewer pinholes through which unwanted direct exchange coupling and shorting can occur.

In a preferred embodiment, the invention provides a magnetic tunnel junction memory cell having a thin metal manganese oxide buffer layer on which a smooth small-grained aluminum oxide barrier layer is seeded. During production of the memory cell structure, the buffer layer is deposited on a ferromagnetic layer. The deposited buffer layer may be oxidized. Aluminum is deposited by sputtering, for example, on the buffer layer, and is oxidized to produce the tunnel junction barrier layer.

The metal manganese buffer layer provides a seeding surface for the deposited metal of the barrier layer. The buffer layer seeds a smoother oxidized metal barrier layer having a smaller grain size than would be achieved by depositing the barrier layer metal directly on the ferromagnetic layer.

BRIEF DESCRIPTION OF THE DRAWINGS

The foregoing and other features of the invention will become more apparent from the detailed description of exemplary embodiments of the invention given below with reference to the accompanying drawings, in which.

DETAILED DESCRIPTION OF THE INVENTION

Figure 1:
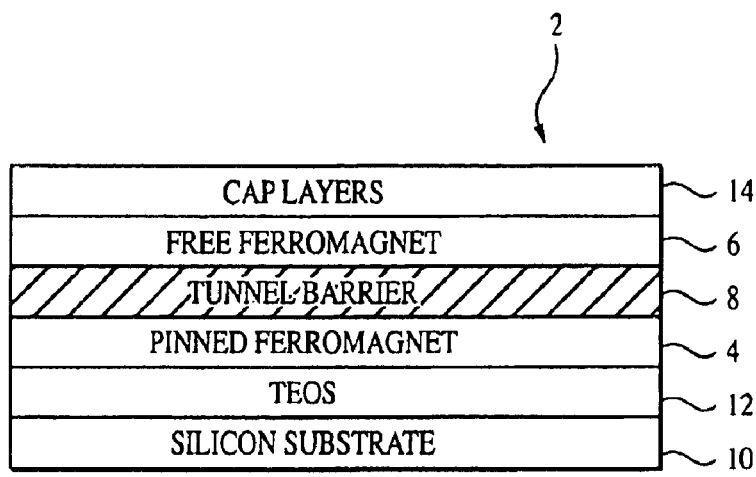
FIG. 1 is a cross section of a conventional magnetic tunnel junction element.
Figure 2:
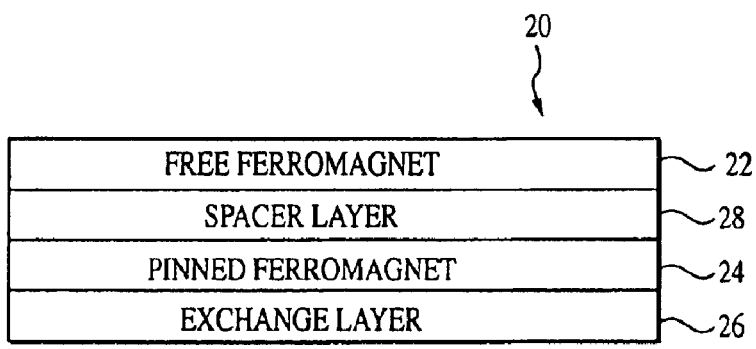
FIG. 2 is a cross section of a conventional GMR element.
Figure 3:
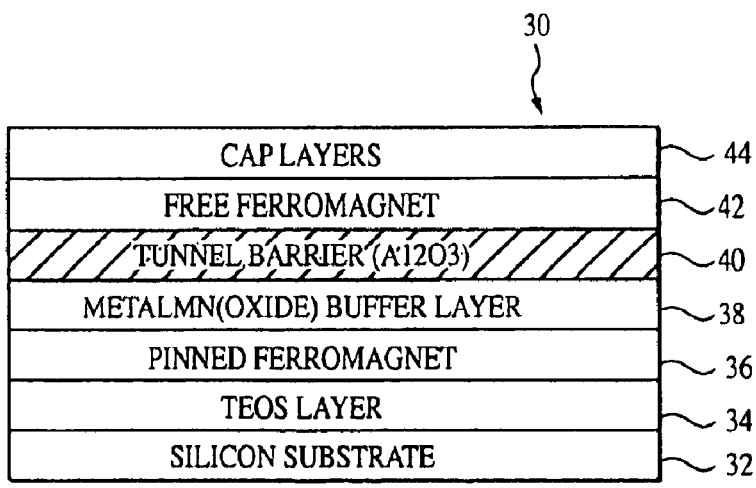
FIG. 3 is a cross section of a magnetic tunnel junction element according to an embodiment of the present invention.

Referring to FIG. 3, a cross section is shown of an exemplary memory cell 30 constructed in accordance with an embodiment of the present invention. The memory cell 30 is formed over a substrate, for example, a silicon substrate 32. Insulating layers such as the illustrated TEOS layer 34 are formed over the substrate 32. A pinned ferromagnetic layer 36, typically formed of one or more layers of a ferromagnetic material and one or more layers of an anti-ferromagnetic material, is formed over the TEOS layer 34 and has a fixed magnetic orientation.

A metal manganese layer, such as FeMn (50:50), is deposited on the pinned ferromagnetic layer 36. FeMn layers can be deposited by sputtering, for example, or by other thin film fabrication techniques known in the art. Subsequent natural and/or assisted oxidation results in the formation of a metal manganese oxide (FeMnO) buffer layer 38.

The buffer layer 38 generally is formed of metal-manganese oxides or mixed metal-manganese oxides. The buffer layer 38 may be formed of various manganese compounds that can be oxidized, including FeMn, NiMn, IrMn, RuMn, PtMn, and FeMnB, for example. The preferred composition includes Mn in the range of about 20% to about 70%. A FeMn composition of about 50:50 is most preferred. Buffer layers having thicknesses of about 2 Angstroms to about 20 Angstroms have been found to be effective, with about 2–3 Å being preferred.

The buffer layer 38 supports the seeding of a smooth, small-grained tunnel barrier layer 40 formed on top of the buffer layer. The tunnel barrier layer is formed by first depositing a metal layer, preferably about 10 angstroms in thickness and formed of aluminum by chemical or physical vapor deposition, for example. The metal layer subsequently is oxidized.

As a result of being deposited on the buffer layer 38, the metal layer which becomes the tunnel barrier layer 40 has smaller grains and thus is smoother. This in turn leads to lower ferromagnetic (Néel) coupling between the pinned and the free layers. Lower coupling is achieved as the result of having fewer pits and/or bumps in the barrier layer. Such surface imperfections create local dipoles in the ferromagnet, which can cause disadvantageous Néel coupling between layers.

In addition, the reduced grain size of the barrier Al layer 38 aids in oxidation of the barrier layer which initiates at grain boundaries and surfaces. Smaller grains lead to more boundaries, and therefore more oxidation initiation sites, which speeds oxidation. Advantageously, reduced oxidation time for the barrier layer leads to less overoxidation of other layers. As an additional benefit, the deposition and subsequent oxidation of the oxide buffer layer also can reduce the probability of oxide pinholes.

A free ferromagnetic layer 42 is formed over the tunnel barrier 40. A protective cap layer 44 is provided over the free ferromagnetic layer 42 and preferably is composed of a metallic material, such as tantalum (Ta), which is stable at high temperatures and exhibits high oxidation resistance. The cap layer 44 typically is about 50 angstroms in thickness.

Those of skill in the art will recognize that placement of the free and pinned ferromagnetic layers is relative. Accordingly, the location of the pinned and free layers can be reversed in the FIG. 3 embodiment. Additional layers also can be used to enhance the operation of magnetic memory cells. Such layers can be interposed between the tunnel barrier layer and the free and pinned magnetic layers, for example. Accordingly, alternative memory cell structures are considered to be within the scope of the present invention, including magnetoresistive structures having the free ferromagnetic layer disposed below the pinned ferromagnetic layer, for example.

Comparisons of magnetic tunnel junctions of the present invention to prior art structures using magnetic hysteresis loops reveal significant decreases in interlayer coupling. Interlayer coupling as high as 75 Oerstads (Oc) can render a magnetic device useless as a memory element. With the structure of the present invention, using a substantially 10 Å buffer layer 38, ferromagnetic coupling is reduced by a factor of about 6–7. Further, the process of the present invention produces magnetic tunnel junctions with reduced magnetic field biasing during switching, lower difference in repeated switching properties, and lower difference in switching characteristics of the manufactured memory elements in the array (low switching sigma).

Figure 4:
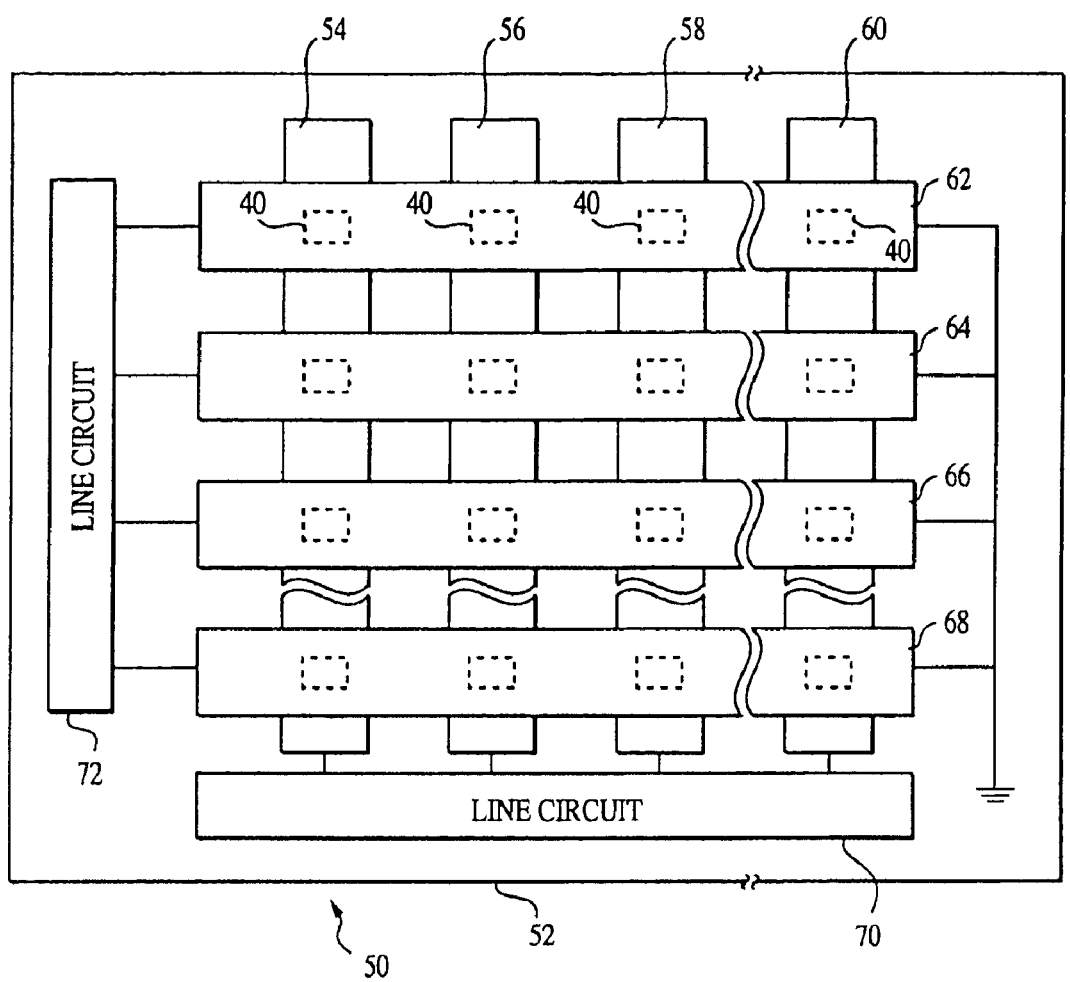
FIG. 4 illustrates a magnetic random access memory (MRAM) device which includes an array of magnetic tunnel junction elements constructed in accordance with an embodiment of the present invention.

Referring to FIG. 4, an MRAM array 50 according to a preferred embodiment of the present invention is illustrated. Array 50 is formed over a substrate 52 and includes multiple column lines 54, 56, 58, 60 and row lines 62, 64, 66, 68. Columns and rows are selected by column and row line circuits 70 and 72, respectively. At the intersection of each column and row line is an MTJ memory element 40 fabricated in accordance with the invention.

Figure 5:
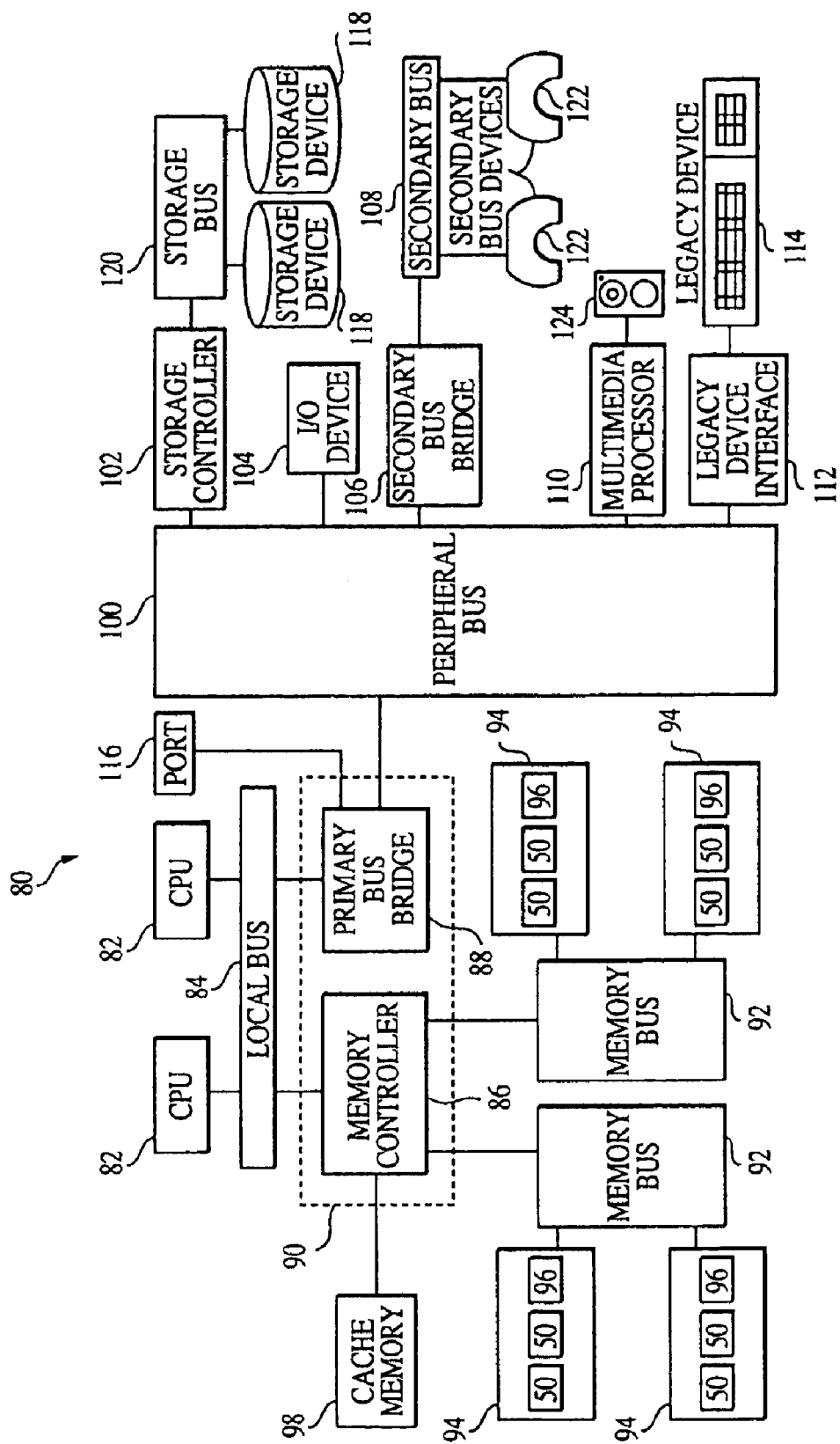
FIG. 5 is a block diagram of a microprocessor-based system including the MRAM device of FIG. 4.

FIG. 5 illustrates an exemplary processing system 80 which may utilize the memory device 50 of the present invention. The processing system 80 includes one or more processors 82 coupled to a local bus 84. A memory controller 86 and a primary bus bridge 88 are also coupled the local bus 84. The processing system 80 may include multiple memory controllers 86 and/or multiple primary bus bridges 88. The memory controller 86 and the primary bus bridge 88 may be integrated as a single device 90.

The memory controller 86 also is coupled to one or more memory buses 92. Each memory bus accepts memory components 94 which include at least one memory device 50 of the present invention. The memory components 94 may be a memory card or a memory module. The memory components 94 may include one or more additional devices 96. The memory controller 86 may also be coupled to a cache memory 98. The cache memory 98 may be the only cache memory in the processing system. Alternatively, other devices, for example, processors 82 may also include cache memories, which may form a cache lierarchy with cache memory 98. If the processing system 80 include peripherals or controllers which are bus masters or which support direct memory access (DMA), the memory controller 86 may implement a cache coherency protocol. If the memory controller 86 is coupled to a plurality of memory buses 92, each memory bus 92 may be operated in parallel, or different address ranges may be mapped to different memory buses 92.

The primary bus bridge 88 is coupled to at least one peripheral bus 100. Various devices, such as peripherals or additional bus bridges may be coupled to the peripheral bus 100. These devices may include a storage controller 102, a miscellaneous I/O device 104, a secondary bus bridge 106 communicating with a secondary bus 108, a multimedia processor 110, and a legacy device interface 112. The legacy device interface 112 is used to couple at least one legacy device 114. The primary bus bridge 88 may also coupled to one or more special purpose high speed ports 116. In a personal computer, for example, the special purpose port might be the Accelerated Graphics Port (AGP), used to couple a high performance video card to the processing system 80.

The storage controller 102 couples one or more storage devices 118, via a storage bus 120, to the peripheral bus 100. For example, the storage controller 102 may be a SCSI controller and storage devices 118 may be SCSI discs. The I/O device 104 may be any sort of peripheral. For example, the I/O device 104 may be a local area network interface, such as an Ethernet card. The secondary bus bridge may be used to interface additional devices via another bus to the processing system. For example, the secondary bus bridge may be a universal serial port (USB) controller used to couple USB devices 122 via to the processing system 80. The multimedia processor 110 may be a sound card, a video capture card, or any other type of media interface, which may also be coupled to one additional devices such as speakers 124. The legacy device interface 112 is used to couple legacy devices, for example, older styled keyboards and mice, to the processing system 80.

The processing system 80 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 82 coupled to memory components 94 and/or memory devices 50. The modifications may include, for example, elimination of unnecessary components, addition of specialized devices or circuits, and/or integration of a plurality of devices.

Figure 6:
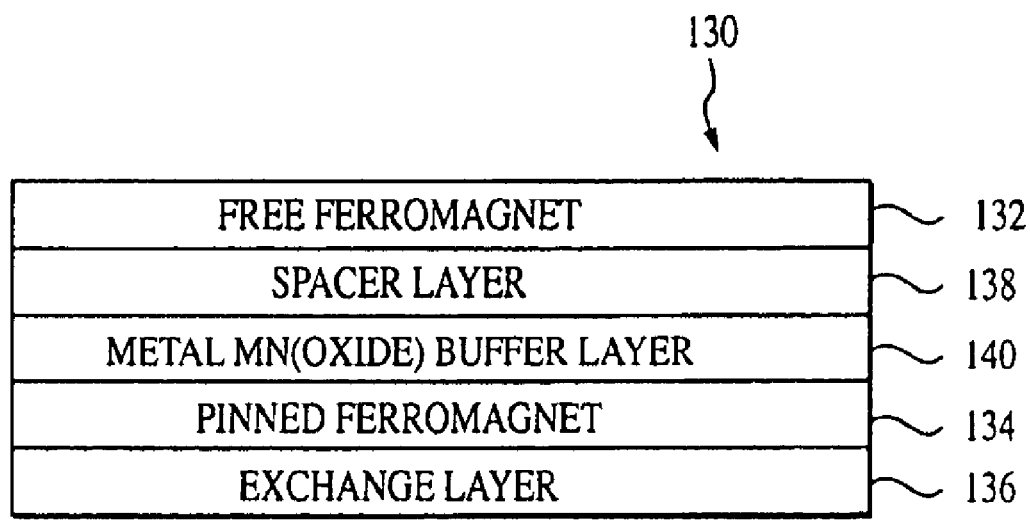
FIG. 6 is a cross section of a GMR sensor element constructed in accordance with an embodiment of the present invention.

Referring to FIG. 6, a magnetic sensor 130 is illustrated according to an embodiment of the present invention. Sensor 130 has a structure similar to the magnetic tunnel junction memory element illustrated in FIG. 3 and described above. The sensor structure 130 includes a free ferromagnetic layer 132 as a sensing layer, commonly made of nickel, iron, or cobalt alloys. An orientation of magnetic moments rotates in the free layer 132 in response to the magnetic patterns on a disk, for example, as the read head passes over the surface of the data bits to be read. A pinned layer 134, generally formed of a cobalt material, is held in a fixed magnetic orientation by an adjacent exchange layer 136. The exchange layer 136 is made of an "antiferromagnetic" material, typically constructed from iron and manganese, and fixes the pinned layer's magnetic orientation. Spacer layer 138 is non-magnetic, typically made from copper, and is disposed between the free and pinned layers. The spacer layer 138 is formed on a metal manganese oxide buffer layer 140. The buffer layer 140 is identical to the buffer layer 38 discussed above in connection with FIG. 3.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A magnetoresistive device comprising:

a free magnetic layer;

a pinned magnetic layer;

an oxide buffer layer; and
a tunnel barrier layer formed on the buffer layer, the buffer layer and the tunnel barrier layer being disposed between the free magnetic layer and the pinned magnetic layer;
wherein said manganese compound oxide buffer layer comprises an oxide of a manganese compound comprising manganese in the range of about 20% to about 70%.

2. The magnetoresistive device of claim 1, wherein the buffer layer is an oxidized deposit of said manganese compound.

3. The magnetoresistive device of claim 1, wherein the buffer layer is formed from a metal manganese compound that comprises at least one of Fe, Ni, Ir, Ru, Pt, and B.

4. The magnetoresistive device of claim 3, wherein the manganese compounds includes at least one of FeMn, NiMn, IrMn, RuMn, PtMn, and FeMnB.

5. The magnetoresistive device of claim 4, wherein the metal manganese compound comprises FeMn.

6. The magnetoresistive device of claim 5, wherein the FeMn stoichiometry is about 50:50.

7. The magnetoresistive device of claim 1, wherein the buffer layer consists essentially of FeMn(oxide).

8. The magnetoresistive device of claim 1, wherein the tunnel barrier layer comprises a metal or metal oxide.

9. The magnetoresistive device of claim 8, wherein the tunnel barrier layer comprises an aluminum oxide.

10. The magnetoresistive device of claim 8, wherein the tunnel barrier layer consists essentially of an aluminum oxide.

11. The magnetoresistive device of claim 1, wherein a thickness of the buffer layer is between about 2 angstroms and about 20 angstroms.

12. The magnetoresistive device of claim 1, wherein the buffer layer is disposed over the pinned ferromagnetic layer and the free ferromagnetic layer is disposed over the tunnel barrier layer.

13. A magnetoresistive device comprising:
a free ferromagnetic layer;
a pinned ferromagnetic layer; an exchange layer for fixing the pinned ferromagnetic layer;
a metal manganese oxide buffer layer; and
a tunnel barrier layer of aluminum oxide formed on the buffer layer, the buffer layer and tunnel barrier layer being disposed between the free magnetic layer and the pinned magnetic layer;
wherein said metal manganese oxide buffer layer comprises an oxide of a metal manganese compound comprising manganese in the range of about 20% to about 70%.

14. A magnetic memory comprising an array of magnetic tunnel junction devices, each magnetic tunnel junction device comprising:
a free magnetic layer;
a pinned magnetic layer;
an maganese compound oxide buffer layer; and
a tunnel barrier layer formed on the buffer layer and disposed between the free magnetic layer and the pinned magnetic layer;
wherein said manganese compound oxide buffer layer comprises an oxide of a manganese compound comprising manganese in the range of about 20% to about 70%.

15. The magnetic memory of claim 14, wherein the buffer layer is an oxidized deposit of said manganese compound.

16. The magnetic memory of claim 14, wherein the manganese compound comprises at least one of Fe, Ni, Ir, Ru, Pt, and B.

17. The magnetic memory of claim 16, wherein the manganese compound includes at least one of FeMn, NiMn, IrMn, RuMn, PtMn, and FeMnB.

18. The magnetic memory of claim 17, wherein the manganese compound comprises FeMn.

19. The magnetic memory of claim 18, wherein the FeMn stoichiometry is about 50:50.

20. The magnetic memory of claim 14, wherein the buffer layer consists essentially of FeMn(oxide).

21. The magnetic memory of claim 14, wherein the tunnel barrier layer comprises a metal or a metal oxide.

22. The magnetic memory of claim 21, wherein the tunnel barrier layer comprises aluminum oxide.

23. The magnetic memory of claim 14, wherein the tunnel barrier layer consists essentially of aluminum oxide.

24. The magnetic memory of claim 14, wherein a thickness of the buffer layer is in a range between about 2 angstroms and about 20 angstroms.

25. The magnetic memory of claim 14, wherein the buffer layer is disposed over the pinned ferromagnetic layer and the free ferromagnetic layer is disposed over the tunnel barrier layer.

26. A microprocessor based system comprising:
a processor; and
a magnetic memory device for exchanging data with the processor, the magnetic memory device including an array of magnetic tunnel junction memory elements, at least some of the magnetic tunnel junction memory elements comprising:
a free magnetic layer;
a pinned magnetic layer;
a maganese compound oxide buffer layer; and
a tunnel barrier layer grown on the buffer layer and disposed between the free magnetic layer and the pinned magnetic layer;
wherein said manganese compound oxide buffer layer comprises an oxide of a manganese compound comprising manganese in the range of about 20% to about 70%.

27. The system of claim 26, wherein the buffer layer is an oxidized deposit of manganese compound.

28. The system of claim 26, wherein the buffer layer comprises a metal manganese compound comprising at least one of Fe, Ni, Ir, Ru, Pt and B.

29. The system of claim 28, wherein the metal manganese compound includes at least one of FeMn, NiMn, IrMn, RuMn, PtMn, and FeMnB.

30. The system of claim 29, wherein the manganese compound comprises FeMn.

31. The system of claim 30, wherein the FeMn stoichiometry is about 50:50.

32. The system of claim 26, wherein the buffer layer consists essentially of FeMn(oxide).

33. The system of claim 26, wherein the tunnel barrier layer includes at least one of a metal or a metal oxide.

34. The system of claim 33, wherein the tunnel barrier layer comprises aluminum oxide.

35. The system of claim 26, wherein the tunnel barrier layer consists essentially of aluminum oxide.

36. The system of claim 26, wherein the buffer layer is between about 2 angstroms and about 20 angstroms thick.

37. The system of claim 26, wherein the buffer layer is disposed over the pinned ferromagnetic layer, and the free ferromagnetic layer is disposed over the tunnel barrier layer.

38. A magnetic sensing device comprising:
 a magnetic sensing layer;
 a pinned magnetic layer;
 an oxide buffer layer; and
 a spacer layer formed on the buffer layer, the buffer layer and spacer layer being disposed between the magnetic sensing layer and the pinned magnetic layer;
 wherein said manganese compound oxide buffer layer comprises an oxide of a manganese compound comprising manganese in the range of about 20% to about 70%.

39. The magnetic sensing device of claim 38, wherein the buffer layer is an oxidized deposit of said manganese compound.

40. The magnetic sensing device of claim 38, wherein the buffer layer is formed from a metal manganese compound comprising at least one of Fe, Ni, Ir, Ru, and Pt.

41. The magnetic sensing device of claim 40, wherein the buffer layer is formed from at least one of FeMn, NiMn, IrMn, RuMn, PtMn, and FeMnB.

42. The magnetic sensing device of claim 41, wherein the metal manganese compound comprises FeMn.

43. The magnetic sensing device of claim 42, wherein the FeMn stoichiometry is about 50:50.

44. The magnetic sensing device of claim 38, wherein the buffer layer consists essentially of FeMn(oxide).

45. The magnetic sensing device of claim 38, wherein the spacer layer comprises a metal.

46. The magnetic sensing device of claim 45, wherein the spacer layer comprises copper.

47. The magnetic sensing device of claim 38, wherein a thickness of the buffer layer is between about 2 angstroms and about 20 angstroms.

48. The magnetic sensing device of claim 38, wherein the buffer layer is disposed over the pinned ferromagnetic layer, and the free ferromagnetic layer is disposed over the spacer layer.

49. A magnetic sensing device comprising:
 a ferromagnetic sensing layer;
 a pinned ferromagnetic layer;
 an exchange layer for fixing the pinned ferromagnetic layer;
 a metal manganese oxide buffer layer; and
 a spacer layer formed on the buffer layer, the buffer layer and spacer layer being disposed between the ferromagnetic sensing layer and the pinned ferromagnetic layer;
 wherein said metal manganese oxide buffer layer comprises an oxide of a metal manganese compound comprising manganese in the range of about 20% to about 70%.

50. The magnetoresistive device of claim 1, wherein the buffer layer is formed as a film.

51. The magnetoresistive device of claim 50, wherein the film is formed on at least one of the free magnetic layer and the pinned magnetic layer.

52. A microprocessor based system comprising:
 a processor; and
 a magnetoresistive device for exchanging data with the processor, the magnetoresistive device including an array of magnetoresistive elements, at least some of the magnetoresistive elements comprising:
 a free magnetic layer;
 a pinned magnetic layer;
 a metal manganese oxide buffer layer; and
 a non-magnetic layer formed on the buffer layer and disposed between the free magnetic layer and the pinned magnetic layer;
 wherein said metal manganese oxide buffer layer comprises an oxide of a metal manganese compound comprising manganese in the range of about 20% to about 70%.

53. The system of claim 52, wherein the buffer layer is an oxidized deposit of said metal manganese compound.

54. The system of claim 52, wherein the metal manganese compound includes at least one of FeMn, NiMn, IrMn, RuMn, PtMn, and FeMnB.

55. The system of claim 54, wherein the metal manganese compound comprises FeMn.

56. The system of claim 55, wherein the FeMn stoichiometry is about 50:50.

57. The system of claim 52, wherein the non-magnetic layer comprises a metal.

58. The system of claim 57, wherein the non-magnetic layer comprises copper.

59. The system of claim 52, wherein the non-magnetic layer comprises a metal oxide.

60. The system of claim 52, wherein the buffer layer is between about 2 angstroms and about 20 angstroms thick.

61. The system of claim 52, wherein the buffer layer is disposed over the pinned ferromagnetic layer, and the free ferromagnetic layer is disposed over the non-magnetic layer.

62. A magnetoresistive device comprising:
 a free magnetic layer;
 a pinned magnetic layer;
 a manganese compound oxide buffer layer; and
 a tunnel barrier layer formed on the buffer layer, the buffer layer and the tunnel barrier layer being disposed between the free magnetic layer and the pinned magnetic layer,
 wherein the buffer layer is formed from at least one of FeMn, NiMn, IrMn, RuMn, PtMn, and FeMnB.

63. A magnetic memory comprising an array of magnetic tunnel junction devices, each magnetic tunnel junction device comprising:
 a free magnetic layer;
 a pinned magnetic layer;
 a manganese compound oxide buffer layer; and
 a tunnel barrier layer formed on the buffer layer and disposed between the free magnetic layer and the pinned magnetic layer,
 wherein the manganese compound includes at least one of FeMn, NiMn, IrMn, RuMn, PtMn, and FeMnB.

64. A magnetic sensing device comprising:
 a magnetic sensing layer;
 a pinned magnetic layer;
 a manganese compound oxide buffer layer; and
 a spacer layer formed on the buffer layer, the buffer layer and spacer layer being disposed between the magnetic sensing layer and the pinned magnetic layer,
 wherein the manganese compound includes at least one of FeMn, NiMn, IrMn, RuMn, PtMn, and FeMnB.

* * * * *

UNITED STATES PATENT AND TRADEMARK OFFICE
CERTIFICATE OF CORRECTION

PATENT NO.   : 6,870,714 B2  
DATED        : March 22, 2005  
INVENTOR(S)  : Joel A. Drewes Page 1 of 1

It is certified that error appears in the above-identified patent and that said Letters Patent is hereby corrected as shown below:

<u>Column 7,</u>  
Line 1, "an oxide" should read -- a manganese compound oxide --;

<u>Column 9,</u>  
Line 4, "an oxide" should read -- a manganese compound oxide --.

Signed and Sealed this

Thirteenth Day of September, 2005

JON W. DUDAS  
*Director of the United States Patent and Trademark Office*